(12) United States Patent
Meninger et al.

(10) Patent No.: US 10,396,803 B2
(45) Date of Patent: Aug. 27, 2019

(54) CLOCK AND DATA RECOVERY OF SUB-RATE DATA

(71) Applicant: Marvell International Ltd., Hamilton (BM)

(72) Inventors: Scott E. Meninger, Groton, MA (US); Ethan Crain, Northborough, MA (US); Mark Spaeth, Marlborough, MA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/165,577

(22) Filed: Oct. 19, 2018

(65) Prior Publication Data

US 2019/0214997 A1 Jul. 11, 2019

Related U.S. Application Data

(60) Provisional application No. 62/615,706, filed on Jan. 10, 2018.

(51) Int. Cl.
*H03L 7/08* (2006.01)
*H03L 7/089* (2006.01)
*H03L 7/081* (2006.01)
*H03L 7/085* (2006.01)

(52) U.S. Cl.
CPC ............ *H03L 7/0807* (2013.01); *H03L 7/085* (2013.01); *H03L 7/0812* (2013.01); *H03L 7/0891* (2013.01)

(58) Field of Classification Search
CPC ....... H03L 7/0807; H03L 7/06; H03L 7/0805; H03L 7/08; H03L 7/0814; H03L 7/0816; H03L 7/083; H03L 7/091; H03L 7/0891
See application file for complete search history.

(56) References Cited

U.S. PATENT DOCUMENTS

2009/0279653 A1* 11/2009 Do .......................... H04L 7/033
375/359

* cited by examiner

*Primary Examiner* — Curtis B Odom
(74) *Attorney, Agent, or Firm* — Hamilton, Brook, Smith & Reynolds, P.C.

(57) ABSTRACT

A clock and data recovery (CDR) circuit operates to recover a clock and sample data from full-rate and sub-rate data signals. The CDR circuit selectively shifts one or more of the sampling clocks based on the rate of a received data signal, facilitating accurate sampling of sub-rate data signals. A masking circuit selectively masks data output bits clocked by a selection of the sampling clocks, thereby outputting relevant sampled data.

20 Claims, 9 Drawing Sheets

CLOCK AND DATA RECOVERY OF SUB-RATE DATA

RELATED APPLICATION

This application claims the benefit of U.S. Provisional Application No. 62/615,706, filed on Jan. 10, 2018. The entire teachings of the above application are incorporated herein by reference.

BACKGROUND

Driven by the fast advancement of applications in several fields of technology, such as cloud computing, autonomous vehicle, and virtual reality, the demand for increasing data throughput is greater than ever before. A typical hardware platform often employs multi-Gbps serial data links, such as PCI express, Ethernet, and serial ATA (SATA). The challenge for transferring data at such high speed with low-cost hardware, such as an FR4 Printed Circuit Board (PCB), is that a transmission channel through which the data is transferred, can cause severe inter-symbol interference (ISI) as a result of being high-loss, non-linear, and/or reflective. ISI degrades the data received by a receiver, such as a serializer/deserializer (SerDes) receiver, where the degradation can include reduced eye height and eye width of the received data signal. Such degradation can increase at higher speeds of data transfer, leading to errors in the sampling of the data signal.

SUMMARY

Example embodiments include a clock and data recovery (CDR) circuit comprising a phase detector and a controller. The phase detector may be configured to detect phase of a data input signal based on a first clock pair and a second clock pair. The controller may be configured to adjust a phase of the first clock pair, based on an output of the phase detector, to align an edge of the first clock pair to an edge of the data input signal. The controller may be further configured to enter one of plural different modes based on a rate of the data signal. In a first mode corresponding to a full-rate data signal, the controller may adjust a phase of the second clock pair, based on an output of the phase detector, to align an edge of the second clock signal to a quadrature phase of the data input signal. In a second mode corresponding to a sub-rate data signal, the controller may shift a first clock of the second clock pair toward a quadrature phase of the data signal. Further, a masking circuit may be configured to selectively mask data bits clocked by a second clock of the second clock pair based on an indication of the first and second mode.

In further embodiments, the masking circuit is further configured to selectively mask the data bits by outputting data bits clocked by the first clock of the second clock pair in place of the data bits clocked by the second clock of the second clock pair. Alternatively, the masking circuit is further configured to selectively mask the data bits by outputting no data bit in place of the data bits. The masking circuit may be further configured to selectively mask data bits clocked by one clock of the first clock pair. The masking circuit may selectively mask the data bits clocked by the one clock of the first clock pair by outputting data bits clocked by the other clock of the first clock pair in place of the data bits clocked by the one clock of the first clock pair. Alternatively, the masking circuit may to selectively mask the data bits clocked by the one clock of the first clock pair by outputting no data bit in place of the data bits clocked by the one clock of the first clock pair.

Further embodiments may include a deserializer configured to deserialize the data input signal based on the first and second clock pairs and output the data bits. A charge pump may be configured to generate a control voltage based on an output of the phase detector, where the controller adjusts the phase of the first and second clock pairs based on the control voltage. The controller may also include a delay-locked loop (DLL) configured to generate the first and second clock pairs based on a reference clock signal. The sub-rate data signal may have a frequency that is a division by $2^n$ of a frequency of the first and second clock pairs, where n is a positive integer.

Further embodiments may include a method of recovering a clock signal and sampling data. A phase of a data input signal may be detected based on a first clock pair and a second clock pair. A phase of the first clock pair may be adjusted, based on the detected phase, to align an edge of the first clock pair to an edge of the data input signal. In a first mode, a phase of the second clock pair may be adjusted, based on the detected phase, to align an edge of the second clock signal to a quadrature phase of the data input signal. In a second mode corresponding to the data signal being a sub-rate data signal, a first clock of the second clock pair may be shifted toward a quadrature phase of the data signal. Data bits clocked by a second clock of the second clock pair may be selectively masked based on an indication of the first and second mode.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 1:
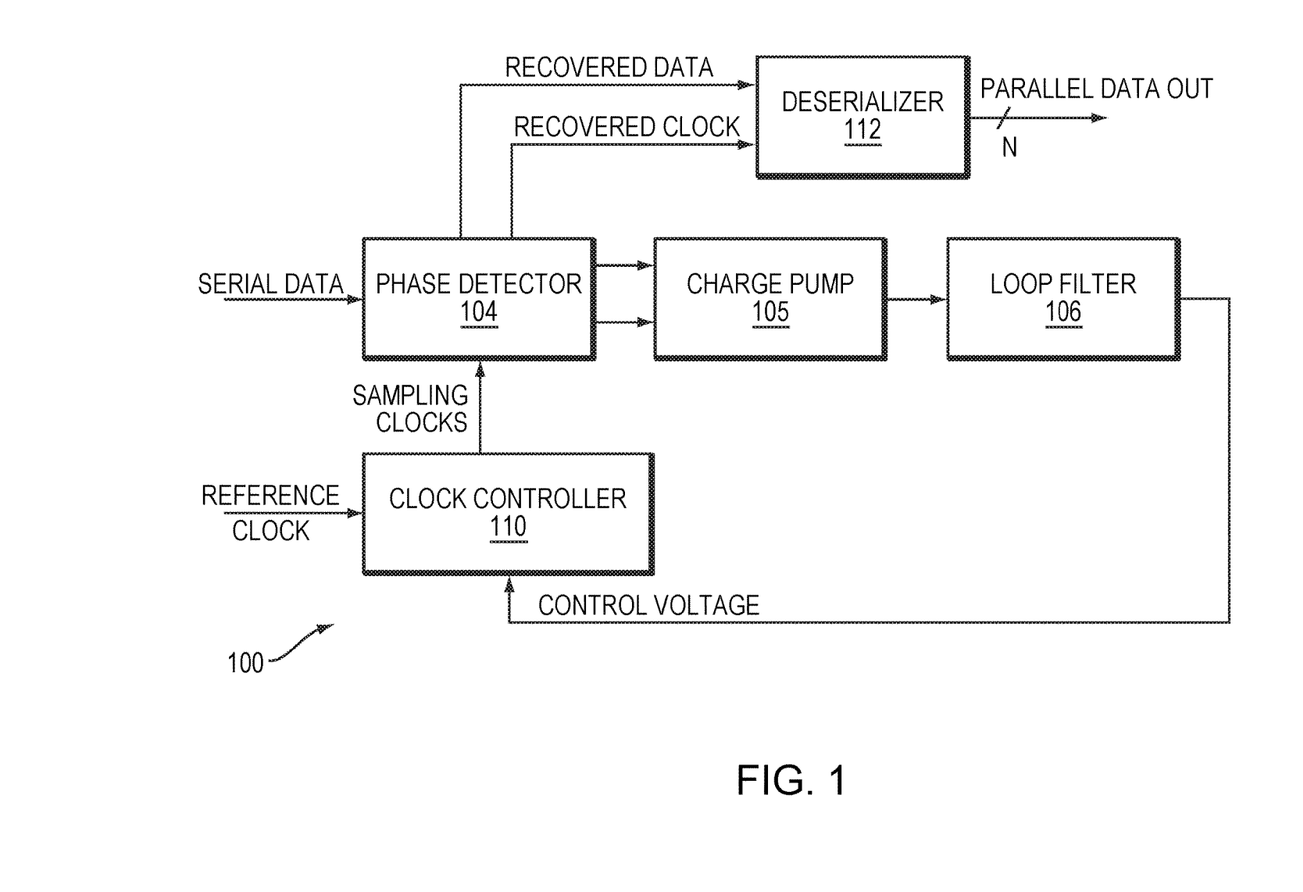
FIG. 1 is a block diagram of a clock and data recovery (CDR) circuit in an example embodiment.

FIG. 1 is a block diagram of a clock and data recovery (CDR) circuit 100 in an example embodiment. The CDR 100 may be configured to receive a serial data signal, generate a recovered clock signal corresponding to the serial data signal, and employ the recovered clock signal to sample the serial data signal. The CDR 100 may further deserialize the serial data signal to provide a parallel data output. A phase detector 104 receives the serial data signal 104 and compares its phase against one or more sampling clocks generated by a clock controller 110. Based on this comparison, the phase detector 104 outputs a feedback signal (e.g., "UP" or "DOWN"), to the charge pump 105, where the feedback signal indicates an adjustment to be made to the sampling clocks to align the sampling clocks to the serial data signal. The charge pump 105, in turn, adjusts a voltage of a control voltage signal based on the feedback signal, and the control voltage signal may be filtered by a loop filter 106 (e.g., a low-pass filter) before receipt by the clock controller 110.

The clock controller 110 may include clock generation circuitry, such as a phase interpolator or a voltage-controlled delay line (VCDL), to generate the sampling clocks. Based on the received control voltage, the clock controller 110 may adjust the phase of the sampling clocks to align with the phase of the serial data signal. The phase detector, having received the aligned sampling clocks, may then output the serial data signal and a recovered clock signal synchronized to the serial data signal. A deserializer 112, clocked by the recovered clock signal, may then translate the serial data signal to a parallel data output.

Figure 2:
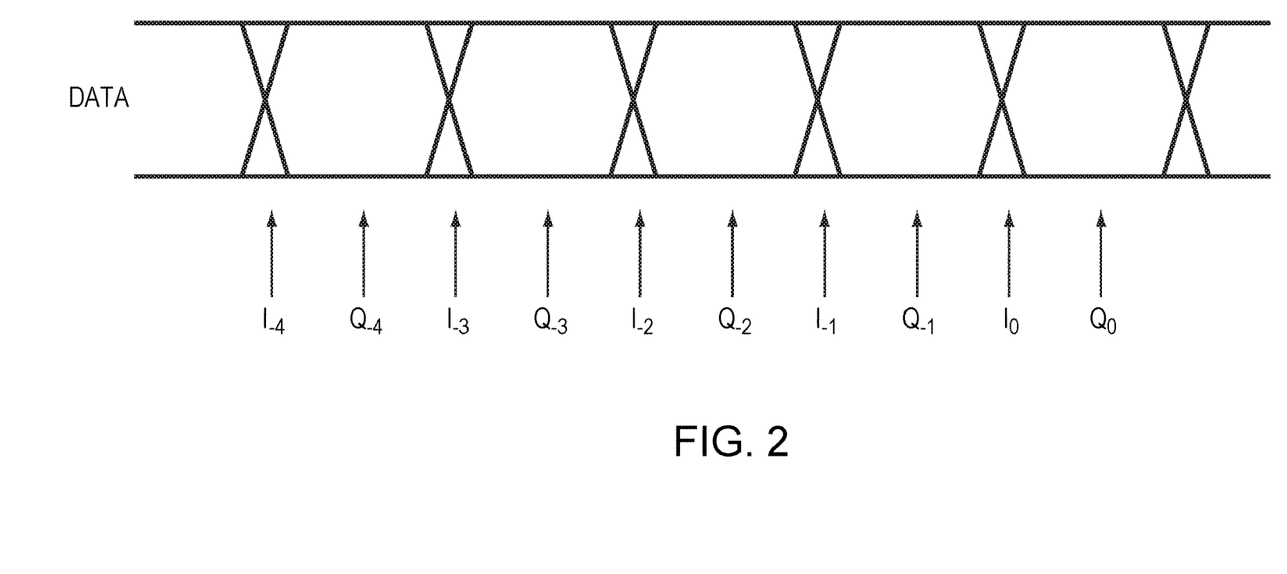
FIG. 2 is a timing diagram of a serial data input signal to be sampled.

FIG. 2 is a timing diagram of a serial data input signal to be sampled. In typical CDR circuits, a single recovered clock signal (or clock pair) may be generated to clock the data. However, in applications involving high-speed data transmission (e.g., 25 GHz), a high-rate serial data signal may be sampled using plural clock pairs. For example, sampling clocks may be implemented to detect both in-phase (I) and quadrature (Q) phases of the serial data signal.

Figure 3:
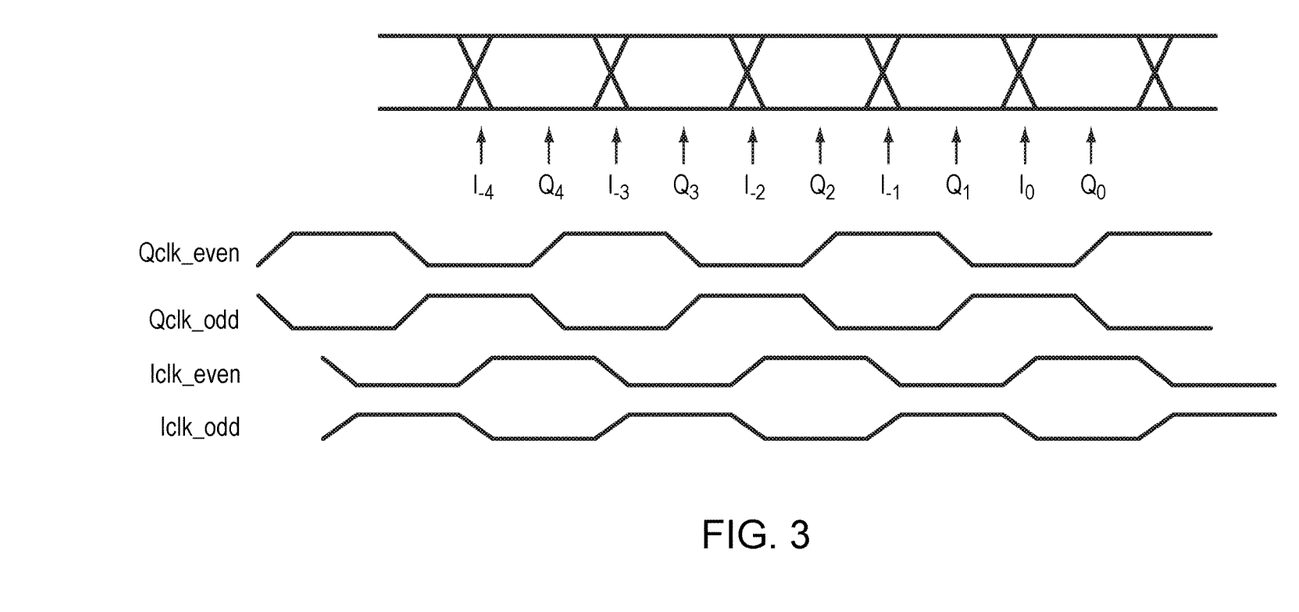
FIG. 3 is a timing diagram of sampling clock pairs that may be employed to sample a serial data input signal.

FIG. 3 is a timing diagram of sampling clock pairs that may be employed to sample a serial data input signal. As shown relative to a serial data signal, an in-phase clock pair ("I clock") may be aligned with the data signal such that the edge transitions of each are aligned. In contrast, a quadrature clock pair ("Q clock") may be aligned with the quadrature phase of the data signal such that the Q clocks transition at or near the center of each bit indicated by the data signal.

Both the I clocks and Q clocks may be employed as sampling clocks in the CDR 100 described above. In particular, for a given edge transition of the data signal, the CDR 100 may employ a preceding Q transition (Q[n−1]), aligned I transition (I[n]), and a successive Q transition (Q[n]) to determine the data edge transition. The Q clocks, due to their quadrature alignment to the data signal, may be used to sample the data by clocking respective data latches (e.g., at a deserializer).

Figure 4:
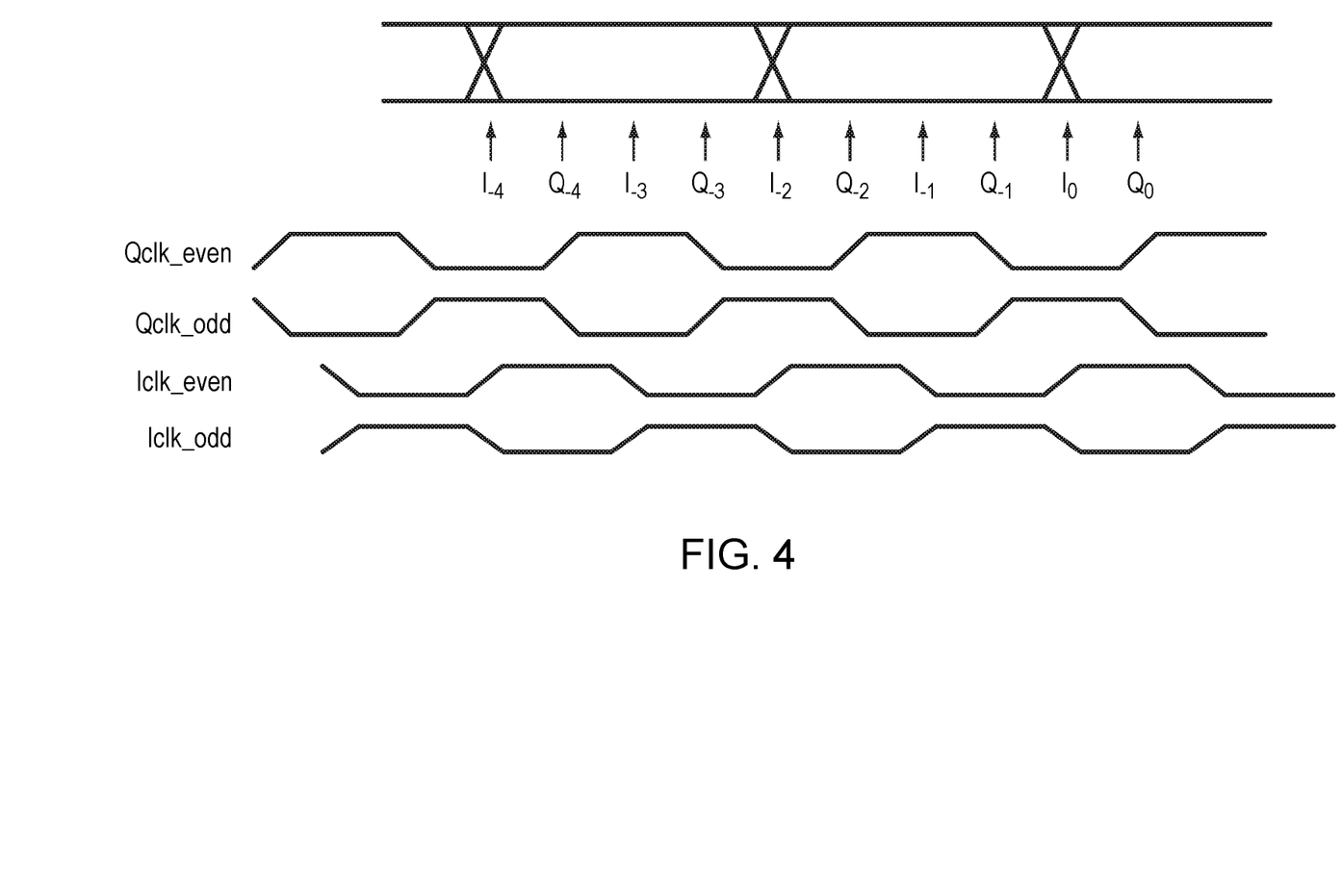
FIG. 4 is a timing diagram of sampling clock pairs compared against a sub-rate data signal.

FIG. 4 is a timing diagram of sampling clock pairs compared against a sub-rate (e.g., half-rate) data signal. The example sub-rate data signal shown exhibits a frequency half that of the full-rate data signal illustrated in FIG. 3. If employing higher-rate Q and I clocks, as shown, in order to facilitate sampling and edge detection, the CDR or other sampling circuitry may reduce the rate of the Q and I clocks to match that of the data. However, a circuit configuration to provide such a rate reduction can be costly. For example, a CDR may require additional dividers, as well as filters operable in a wider dynamic range, to provide the I and Q clocks and full-rate and sub-rate frequencies.

Example embodiments provide for clock recovery and data sampling of full rate and sub-rate serial data signals. Referring again to the CDR 100 of FIG. 1, the clock controller 110 may be configured to generate the Q and I clocks at a full rate to sample and recover a clock from a serial data signal having a corresponding rate. In response to detecting a sub-rate serial data signal, the clock controller 110 may generate the Q and I clocks to include at least one shifted clock signal. The clock controller may detect that the serial data signal is sub-rate, as well as its specific rate, via an accompanying indicator signal or on-board frequency detection circuitry. The parameters of the shifted clock signal may be dependent on the properties of the sub-rate signal (e.g., half-rate, quarter-rate), and the phase detector 104 and/or the deserializer 112 may employ the shifted clock signal, in place of a non-shifted clock, to sample the data signal. The clock controller 110 may selectively enable the shifted clock signal via a delay circuit or other element to shift the phase of one or more of the Q and I clocks. As a result, the CDR 100 can provide clock recovery and data sampling of full rate and sub-rate data signals efficiently and without the need for additional divider or filtering circuitry.

Figure 5:
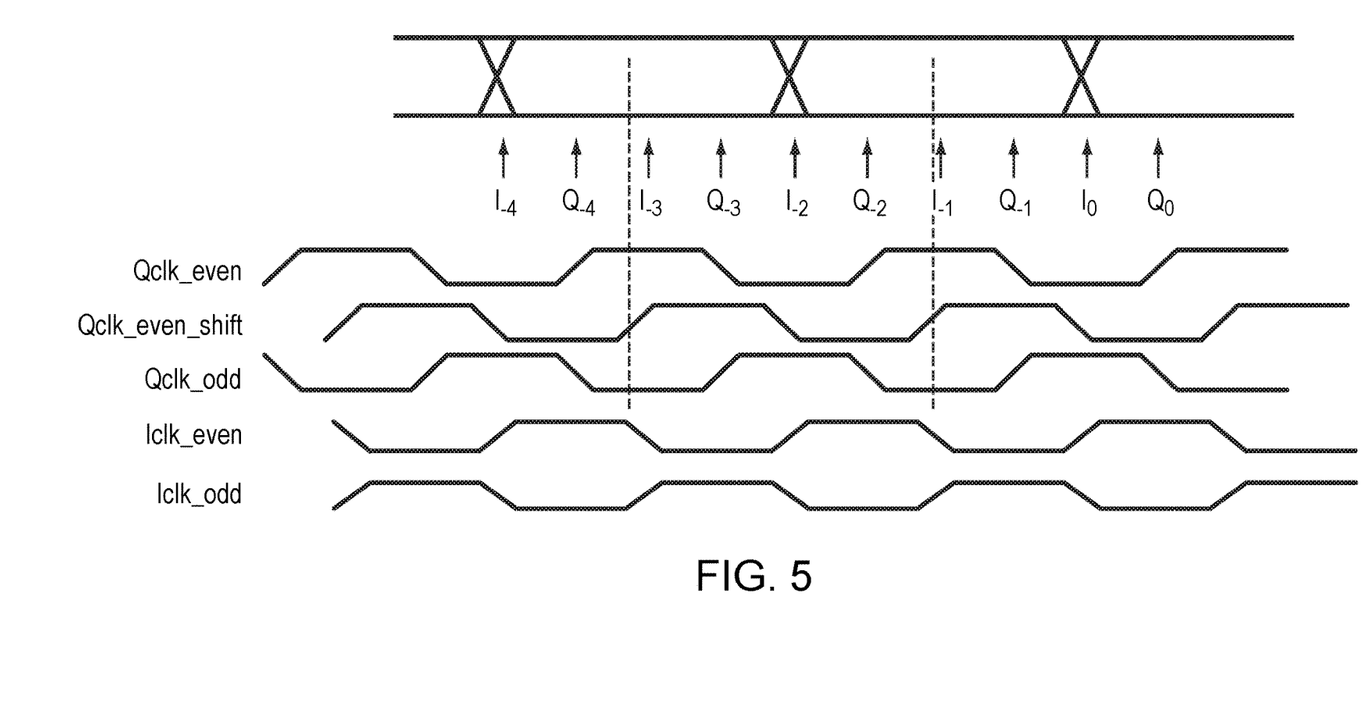
FIG. 5 is a timing diagram of sampling clock pairs including a shifted clock signal.

FIG. 5 is a timing diagram of sampling clock pairs, including a shifted clock signal, for sampling a half-rate data signal. With reference to FIG. 1, the clock controller 110 may delay the "even" Q clock, by approximately a single phase, to provide a shifted even Q clock ("Qclk_even_shift"). Because the data signal is half-rate relative to the Q and I clocks, only one of the Q clock pair is needed to sample the data signal. Thus, the "odd" Q clock need not be shifted, and the sampling result clocked by the "odd" Q clock may be disregarded. Alternatively, the "odd" Q clock may be shifted along with the "even" Q clock. Likewise, the sampling result of the "odd" I clock may be disregarded, as the rising edge of the "even" I clock can be aligned to each transition of the half-rate data signal. Accordingly, when sampling the data signal (e.g., at the deserializer), the data sampled by the "odd" Q and I clocks may be masked from the data output.

Figure 6:
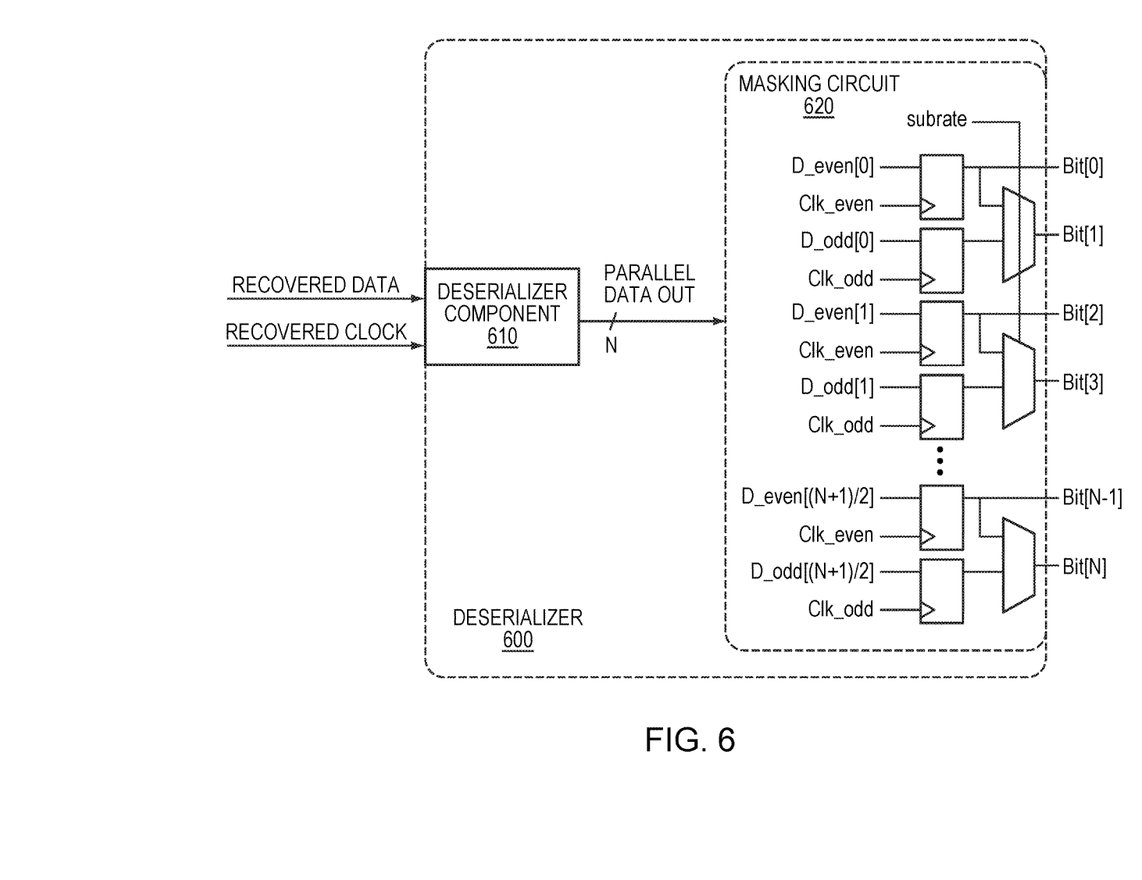
FIG. 6 is a circuit diagram of a deserializer including a masking circuit in one embodiment.

FIG. 6 is a circuit diagram of a deserializer 600 including a masking circuit 620 in one embodiment. The deserializer 600 may be implemented in the CDR 100 of FIG. 1, and includes a deserializer component 610 to provide a parallel data signal from recovered clock and data signals. The masking circuit 620 may include an arrangement of flip-flops and multiplexers, where each flip-flop is configured to latch a respective bit of the data word to be output in parallel. Each flip-flop is clocked by one of the "even" or "odd" sampling clocks as required to latch a full-rate data stream. For half-rate data, in contrast, the disregarded "odd" bits may be masked by an arrangement of multiplexers, where each "even" and "odd" bit pair is connected to the input of a respective multiplexer. In response to a "subrate" signal indicating that the data signal is half-rate, each multiplexer may select the "even" bit to output as the "odd" bit in place of the data bit clocked by the "odd" sampling clock. The resulting data output may include a plurality of matched bit pairs, in contrast to distinct individual bits under a full-rate data output. When applied to sampling circuitry implementing data paths that are clocked by both I and Q clocks as described above, the masking circuit 620 may be applied to mask the data bits clocked by both of the "odd" I and Q clocks. In an alternative embodiment, the masking circuit 620 may block output of the "odd" bits rather than outputting the "even" bits in their place.

Figure 7:
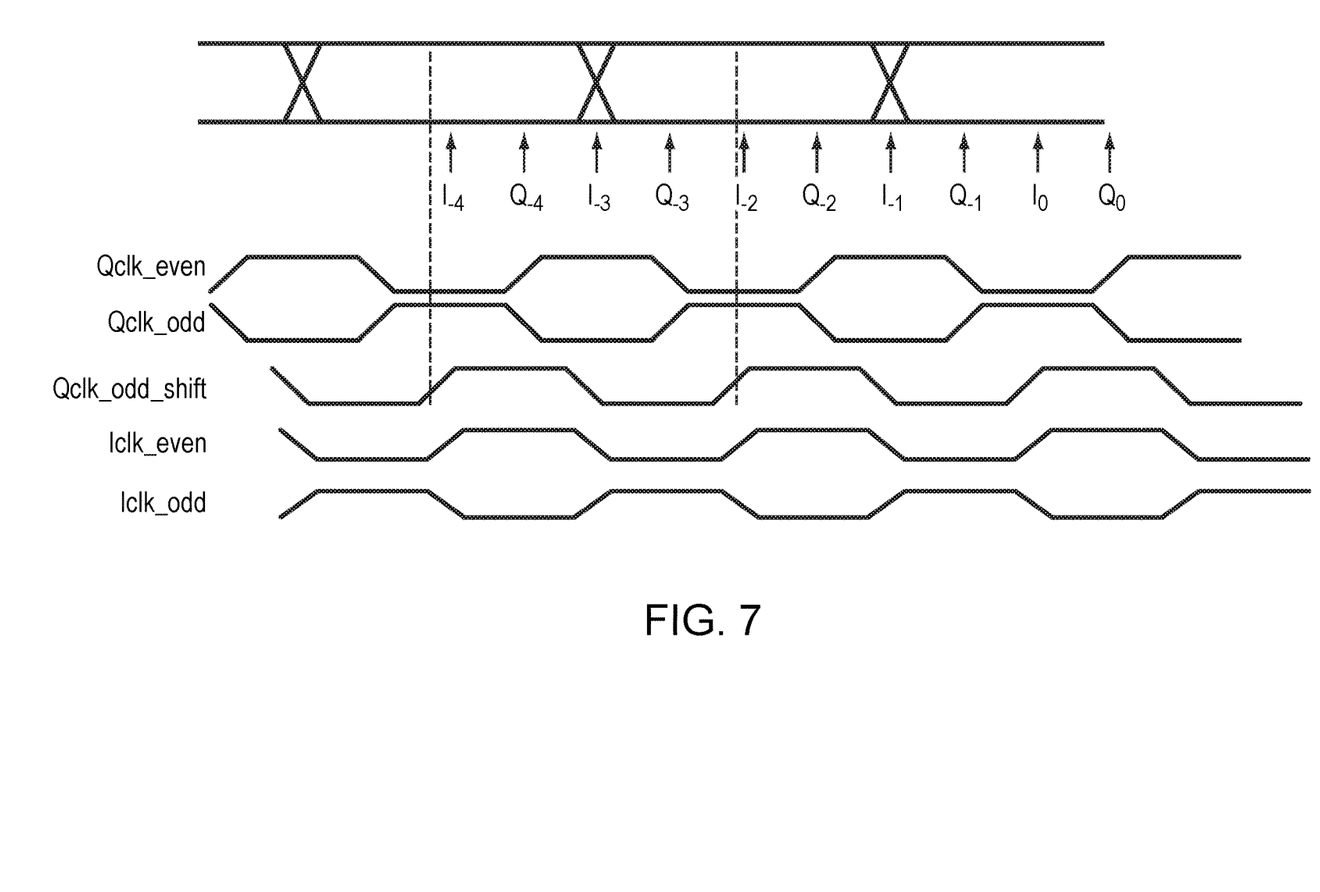
FIG. 7 is a timing diagram of sampling clock pairs including a shifted clock signal in a further embodiment.
Figure 8:
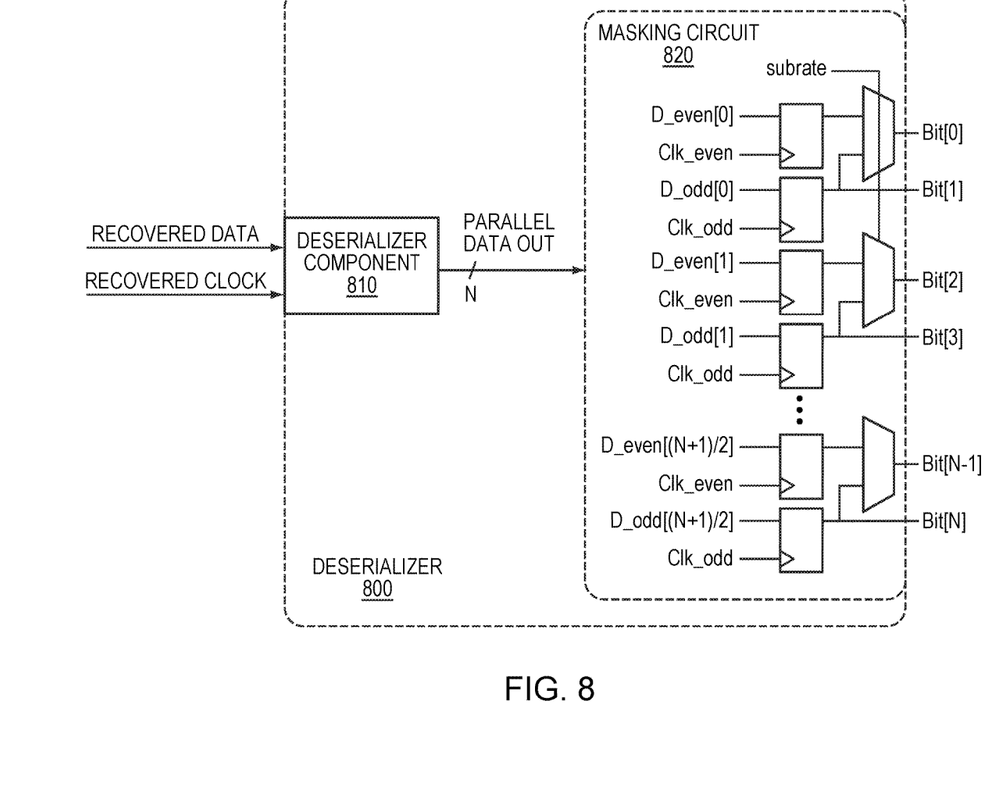
FIG. 8 is a circuit diagram of a deserializer including a masking circuit in one embodiment.

By shifting a clock of the sampling clocks and masking the "odd" data in this manner, a CDR may be able to employ the same control logic to recover a clock and sample data from both full-rate and sub-rate data input signals. Further, the CDR may use the same data paths to provide the data output for both full-rate and sub-rate data input signals FIG. 7 and FIG. 8 illustrate a timing diagram and a circuit diagram, respectfully, in a further embodiment. This embodiment may incorporate the features described above with reference to FIGS. 5 and 6, with the exception that the "odd" Q clock is shifted instead of the "even" Q clock, and the shifted "odd" Q clock is used to sample the half-rate data signal. Accordingly, a deserializer 800, which includes a comparable deserializer component 810, includes a masking circuit 820 that selectively masks the even bits of the data output in response to an indication of a subrate data signal.

In an alternative embodiment, referring again to FIGS. 1 and 3, the CDR 100 may be configured to employ the "even" I clock to perform edge detection on the sub-rate data signal, and employ the "odd" I clock to sample the sub-rate data signal. In such an embodiment, the data clocked by the Q clocks may be disregarded. To mask the data output accordingly, the data paths sampled by the I clocks may be multiplexed with the data paths sampled by the Q clocks, enabling the "I data" to be selectively output in place of the "Q data" for sub-rate data.

Figure 9:
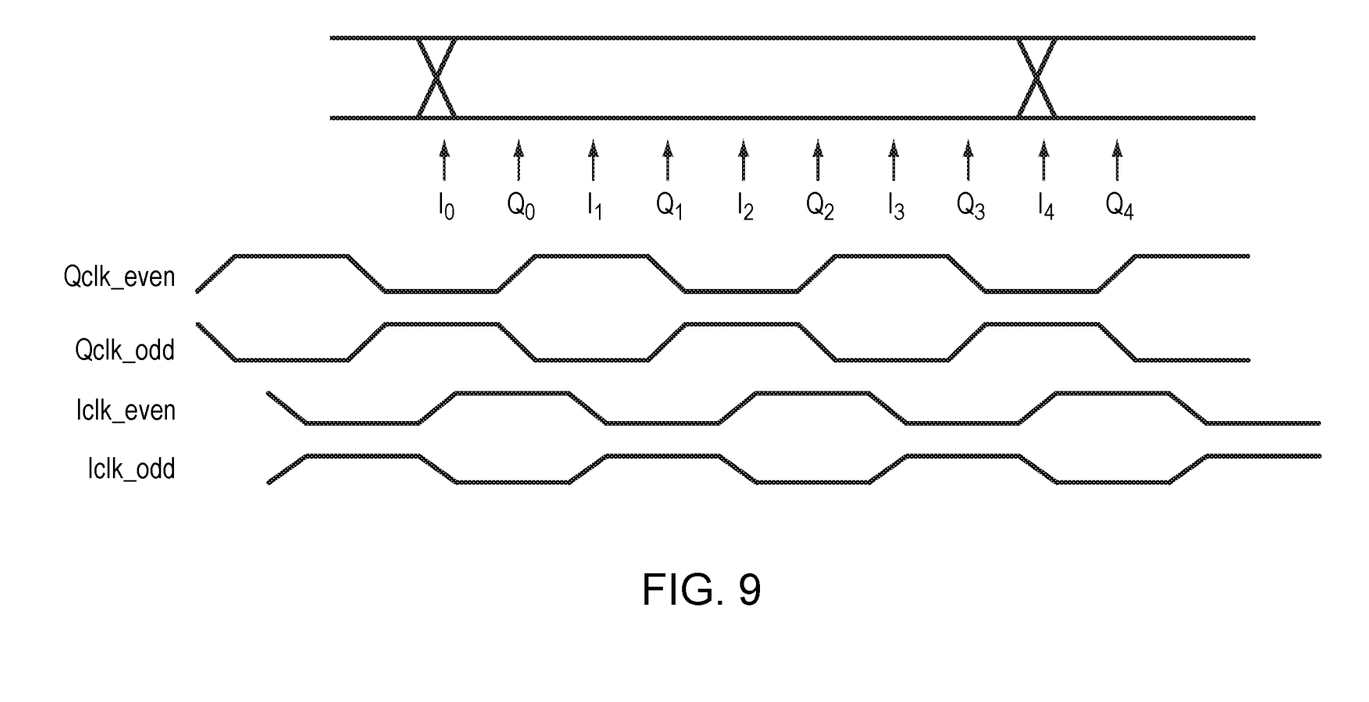
FIG. 9 is a timing diagram of sampling clock pairs compared against a sub-rate data signal in a further embodiment.

FIG. 9 is a timing diagram of sampling clock pairs compared against a quarter-rate data signal. In a further embodiment, with reference to FIG. 1, the CDR 100 may be configured to enter respective modes to process a full rate and half-rate data signal, as described above, in addition to the quarter-rate data signal. To sample the quarter-rate data signal, the CDR 100 may not need to shift either of the Q clocks, as the quarter-rate data may be reliably sampled via a Q clock near the quadrature phase of the data signal (e.g., $Q_1$ and/or $Q_2$). However, a masking circuit (e.g., 620, 820) may mask the data bits in groups of 4 rather than in the pairs described above. For example, when enabled to mask the quarter-rate signal, the masking circuit may output the $I_0$ data for all of $I_0$-$I_3$ outputs, and may output the $Q_1$ data for all of $Q_1$-$Q_4$ outputs.

As a result, the CDR 100 may employ the same architecture and process for recovering a clock and sampling a data signal at a full-rate, half-rate and quarter rate using sampling clocks having a common rate. Further, the CDR 100 may be adapted for clock and data recovery of other sub-rate data signals, such as rates further divided by $2^n$ or 2*n from the full-rate sampling clocks, where n is a positive integer (e.g., eighth-rate, sixteenth-rate data). For such sub-rates, the CDR 100 may select an appropriate phase of the Q clock for sampling the data, and then mask groups of the data output to the selected phase, where the group is populated as a function of the data rate (e.g., half-rate=2, quarter-rate=4, eighth-rate=8, etc.). Further, example embodiments may be implemented in clock recovery and data sampling circuitry other than the CDR 100, such as a phase-locked loop (PLL)-based CDR, a synchronous oscillator, or a gated oscillator.

While example embodiments have been particularly shown and described, it will be understood by those skilled in the art that various changes in form and details may be made therein without departing from the scope of the embodiments encompassed by the appended claims.

What is claimed is:

1. A clock and data recovery (CDR) circuit comprising:
   a phase detector configured to detect phase of a data input signal based on a first clock pair and a second clock pair;
   a controller configured to adjust a phase of the first clock pair, based on an output of the phase detector, to align an edge of the first clock pair to an edge of the data input signal, the controller further configured to:
   1) in a first mode, adjust a phase of the second clock pair, based on an output of the phase detector, to align an edge of the second clock signal to a quadrature phase of the data input signal; and
   2) in a second mode corresponding to the data signal being a sub-rate data signal, shift a first clock of the second clock pair toward a quadrature phase of the data signal; and
   a masking circuit configured to selectively mask data bits clocked by a second clock of the second clock pair based on an indication of the first and second mode.

2. The circuit of claim 1, wherein the masking circuit is further configured to selectively mask the data bits by outputting data bits clocked by the first clock of the second clock pair in place of the data bits clocked by the second clock of the second clock pair.

3. The circuit of claim 1, wherein the masking circuit is further configured to selectively mask the data bits by outputting no data bit in place of the data bits.

4. The circuit of claim 1, wherein the masking circuit is further configured to selectively mask data bits clocked by one clock of the first clock pair.

5. The circuit of claim 4, wherein the masking circuit is further configured to selectively mask the data bits clocked by the one clock of the first clock pair by outputting data bits clocked by the other clock of the first clock pair in place of the data bits clocked by the one clock of the first clock pair.

6. The circuit of claim 4, wherein the masking circuit is further configured to selectively mask the data bits clocked by the one clock of the first clock pair by outputting no data bit in place of the data bits clocked by the one clock of the first clock pair.

7. The circuit of claim 1, further including a deserializer configured to deserialize the data input signal based on the first and second clock pairs and output the data bits.

8. The circuit of claim 1, further comprising a charge pump configured to generate a control voltage based on an output of the phase detector, the controller further configured to adjust the phase of the first and second clock pairs based on the control voltage.

9. The circuit of claim 1, wherein the controller includes a delay-locked loop (DLL) configured to generate the first and second clock pairs based on a reference clock signal.

10. The circuit of claim 1, wherein the sub-rate data signal has a frequency that is a division by $2^n$ of a frequency of the first and second clock pairs, where n is a positive integer.

11. A method comprising:
    detecting a phase of a data input signal based on a first clock pair and a second clock pair;
    adjusting a phase of the first clock pair, based on the detected phase, to align an edge of the first clock pair to an edge of the data input signal;
    in a first mode, adjusting a phase of the second clock pair, based on the detected phase, to align an edge of the second clock signal to a quadrature phase of the data input signal;
    in a second mode corresponding to the data signal being a sub-rate data signal, shifting a first clock of the second clock pair toward a quadrature phase of the data signal; and
    selectively masking data bits clocked by a second clock of the second clock pair based on an indication of the first and second mode.

12. The method of claim 11, further comprising selectively masking the data bits by outputting data bits clocked by the first clock of the second clock pair in place of the data bits clocked by the second clock of the second clock pair.

13. The method of claim 11, further comprising selectively masking the data bits by outputting no data bit in place of the data bits.

14. The method of claim 11, further comprising selectively masking data bits clocked by one clock of the first clock pair.

15. The method of claim 14, further comprising selectively masking the data bits clocked by the one clock of the first clock pair by outputting data bits clocked by the other clock of the first clock pair in place of the data bits clocked by the one clock of the first clock pair.

16. The method of claim 14, further comprising selectively masking the data bits clocked by the one clock of the first clock pair by outputting no data bit in place of the data bits clocked by the one clock of the first clock pair.

17. The method of claim 11, further comprising deserializing the data input signal based on the first and second clock pairs and outputting the data bits as a function of the deserializing.

18. The method of claim 11, further comprising generating a control voltage based on an output of the phase detector and adjusting the phase of the first and second clock pairs based on the control voltage.

19. The method of claim 11, further comprising controlling a delay-locked loop (DLL) to generate the first and second clock pairs based on a reference clock signal.

20. The method of claim 11, wherein the sub-rate data signal has a frequency that is a division by 2*n of a frequency of the first and second clock pairs, where n is a positive integer.

* * * * *